(12) United States Patent
Snider

(10) Patent No.: US 7,228,518 B2
(45) Date of Patent: Jun. 5, 2007

(54) METHOD FOR REDUCING THE SIZE AND NANOWIRE LENGTH USED IN NANOWIRE CROSSBARS WITHOUT REDUCING THE NUMBER OF NANOWIRE JUNCTIONS

(75) Inventor: Gregory S. Snider, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 86 days.

(21) Appl. No.: 11/047,858

(22) Filed: Jan. 31, 2005

(65) Prior Publication Data

US 2006/0190896 A1   Aug. 24, 2006

(51) Int. Cl.
*G06F 17/50* (2006.01)
(52) U.S. Cl. .................. 716/12; 977/932; 977/940
(58) Field of Classification Search ............ 716/12–14; 977/932, 940
See application file for complete search history.

(56) References Cited

U.S. PATENT DOCUMENTS

2006/0129340 A1* 6/2006 Straznicky .................. 702/65

* cited by examiner

*Primary Examiner*—Paul Dinh
*Assistant Examiner*—Suresh Memula

(57) ABSTRACT

Various embodiments of the present invention provide methods for designing multilayer nanowire crossbars that are functionally equivalent to two-layer nanowire-crossbar designs. Given a two-layer nanowire-crossbar design having two or more columns of microregions, in certain embodiments, the method conceptually folds the two-layer nanowire crossbar between columns of microregions. The folded nanowires, located in the conceptually folded, two-layer nanowire-crossbar design, are collapsed into shorter length nanowires to give a multilayer nanowire-crossbar design that includes the same number of nanowire junctions as in the two-layer nanowire-crossbar design.

18 Claims, 13 Drawing Sheets ing the two-layer lattice design, shown in FIGS. 6A–6B.

METHOD FOR REDUCING THE SIZE AND NANOWIRE LENGTH USED IN NANOWIRE CROSSBARS WITHOUT REDUCING THE NUMBER OF NANOWIRE JUNCTIONS

TECHNICAL FIELD

The present invention relates to nanoscale electronic devices, and, in particular, to methods for reducing the surface area occupied by, and the total length of, nanowires needed to construct nanowire crossbars without reducing the number of nanowire junctions.

BACKGROUND OF THE INVENTION

During the past fifty years, the electronics and computing industries have been relentlessly propelled forward by the ever decreasing sizes of basic electronic components, such as transistors and signal lines, and by the correspondingly ever increasing component densities of integrated circuits, including processors and electronic memory chips. Eventually, however, it is expected that fundamental component-size limits will be reached in semiconductor-circuit-fabrication technologies based on photolithographic methods. As the size of components decreases below the resolution limit of ultraviolet light, for example, far more technically demanding and expensive higher-energy-radiation-based technologies need to be employed to create smaller components using photolithographic techniques. Not only must expensive semiconductor fabrication facilities be rebuilt in order to use the new techniques, many new obstacles are expected to be encountered. For example, it is necessary to construct semiconductor devices through a series of photolithographic steps, with precise alignment of the masks used in each step with respect to the components already fabricated on the surface of a nascent semiconductor. As the component sizes decrease, precise alignment becomes more and more difficult and expensive. As another example, the probabilities that certain types of randomly distributed defects in semiconductor surfaces result in defective semiconductor devices may increase as the sizes of components manufactured on the semiconductor services decrease, resulting in an increasing proportion of defective devices during manufacture, and a correspondingly lower yield of useful product. Ultimately, various quantum effects that arise only at molecular-scale distances may altogether overwhelm current approaches to component construction in semiconductors.

In view of these problems, researchers and developers have expended considerable research effort in fabricating microscale and nanoscale electronic devices using alternative technologies. Nanoscale electronic devices generally employ nanoscale signal lines having widths, and nanoscale components having dimensions, of less than 100 nanometers. More densely fabricated nanoscale electronic devices may employ nanoscale signal lines having widths, and nanoscale components having dimensions, of less than 50 nanometers.

Although general nanowire technologies have been developed, it is not necessarily straightforward to employ nanowire technologies to miniaturize existing types of circuits and structures. While it may be possible to tediously construct miniaturized, nanowire circuits similar to the much larger, current circuits, it is impractical, and often impossible, to manufacture such miniaturized circuits using current technologies. Even were such straightforwardly miniaturized circuits able to be feasibly manufactured, the much higher component densities that ensue from combining together nanoscale components necessitate much different strategies related to removing waste heat produced by the circuits. In addition, the electronic properties of substances may change dramatically at nanoscale dimensions, so that different types of approaches and substances may need to be employed for fabricating even relatively simple, well-known circuits and subsystems at nanoscale dimensions. Thus, new implementation strategies and techniques need to be employed to develop and manufacture useful circuits and structures at nanoscale dimensions using nanowires.

Nanoscale electronic devices can be constructed by selectively fabricating simple electronic components, such as conductors, transistors, resistors, and diodes, and other simple components, at nanowire crossing points. However, it remains desirable, as with many hardware implementations, to further reduce the overall size, and to increase the speed, of nanoscale electronic devices and integrated circuits that employ these simple electronic components at nanowire crossing points. Unfortunately, the current methods by which nanowire circuitry is manufactured are not amenable to simple miniaturization. Instead, designers, manufacturers, and users of nanoscale electronic devices that include nanowire circuitry have recognized the need for new methods of fabricating smaller and faster nanoscale hardware.

SUMMARY OF THE INVENTION

Various embodiments of the present invention are directed to methods for designing multilayer-nanowire crossbars that are functionally equivalent to two-layer nanowire-crossbar designs. Given a two-layer nanowire-crossbar design having two or more columns of microregions, the method conceptually folds the two-layer nanowire crossbar between the microregions. The folded nanowires, located in the conceptually folded, two-layer nanowire-crossbar design, are collapsed into shorter length nanowires to give a multilayer nanowire-crossbar design that includes the same number of nanowire junctions as contained in the two-layer nanowire-crossbar design.

DETAILED DESCRIPTION OF THE INVENTION

As discussed below, nanowire crossbars represent one of a number of emerging nanoscale-electronic circuit configuration media that can be used to construct nanoscale electronic circuits. Various embodiments of the present invention are directed to methods for designing nanowire crossbars having three or more layers of crossing nanowires that are functionally equivalent to nanowire crossbars having two layers of crossing nanowires. Nanowire crossbars having two layers of crossing nanowires are referred to as "two-layer nanowire crossbars," and nanowire crossbars having three or more layers of crossing nanowires are referred to as "multilayer nanowire crossbars." A multilayer nanowire crossbar that is functionally equivalent to a two-layer nanowire crossbar is designed by conceptually folding the two-layer nanowire-crossbar design and collapsing each folded nanowire into a straight nanowire. Multilayer nanowire crossbars that are constructed according to the methods of the present invention need less surface area for implementation and need less nanowire than functionally equivalent two-layer nanowire crossbars. Moreover, constructing multilayer nanowire crossbars that are functionally equivalent two-layer nanowire crossbars can be accomplished without reducing the number of nanowire crossing points available for configuring electronic components. The present invention is described below in the following two subsections: (1) nanowire crossbars, and (2) embodiments of the present invention.

Nanowire Crossbars

Figure 1:
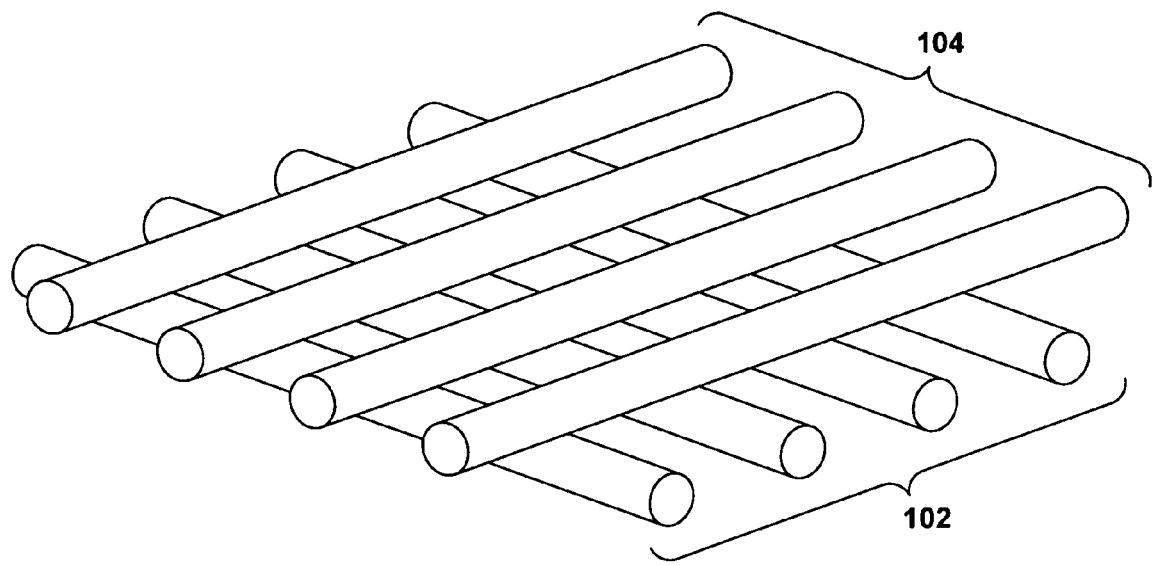
FIG. 1 illustrates a basic two-layer nanowire crossbar.

A relatively new and promising technology involves nanowire crossbars. FIG. 1 illustrates a two-layer nanowire crossbar. In FIG. 1, a first layer of approximately parallel nanowires 102 is overlain by a second layer of approximately parallel nanowires 104 roughly perpendicular, in orientation, to the nanowires of the first layer 102, although the orientation angle between the layers may vary. The two layers of nanowires form a lattice, or crossbar, each nanowire of the second layer 104 overlying all of the nanowires of the first layer 102 and coming into close contact with each nanowire of the first layer 102 at intersection points, or nanowire junctions that represent the closest contact between two nanowires.

Nanowires can be fabricated using mechanical nanoprinting techniques. Alternatively, nanowires can be chemically synthesized and can be deposited as layers of nanowires in one or a few process steps. Other alternative techniques for fabricating nanowires may also be employed. Thus, a two-layer nanowire crossbar comprising first and second layers, as shown in FIG. 1, can be manufactured via a relatively straightforward process. Many different types of conductive and semi-conductive nanowires can be chemically synthesized from metallic and semiconductor substances, from combinations of these types of substances, and from other types of substances. A nanowire crossbar may be connected to microscale signal-line leads or other electronic leads through a variety of different methods to incorporate the nanowires into electrical circuits.

Figure 2:
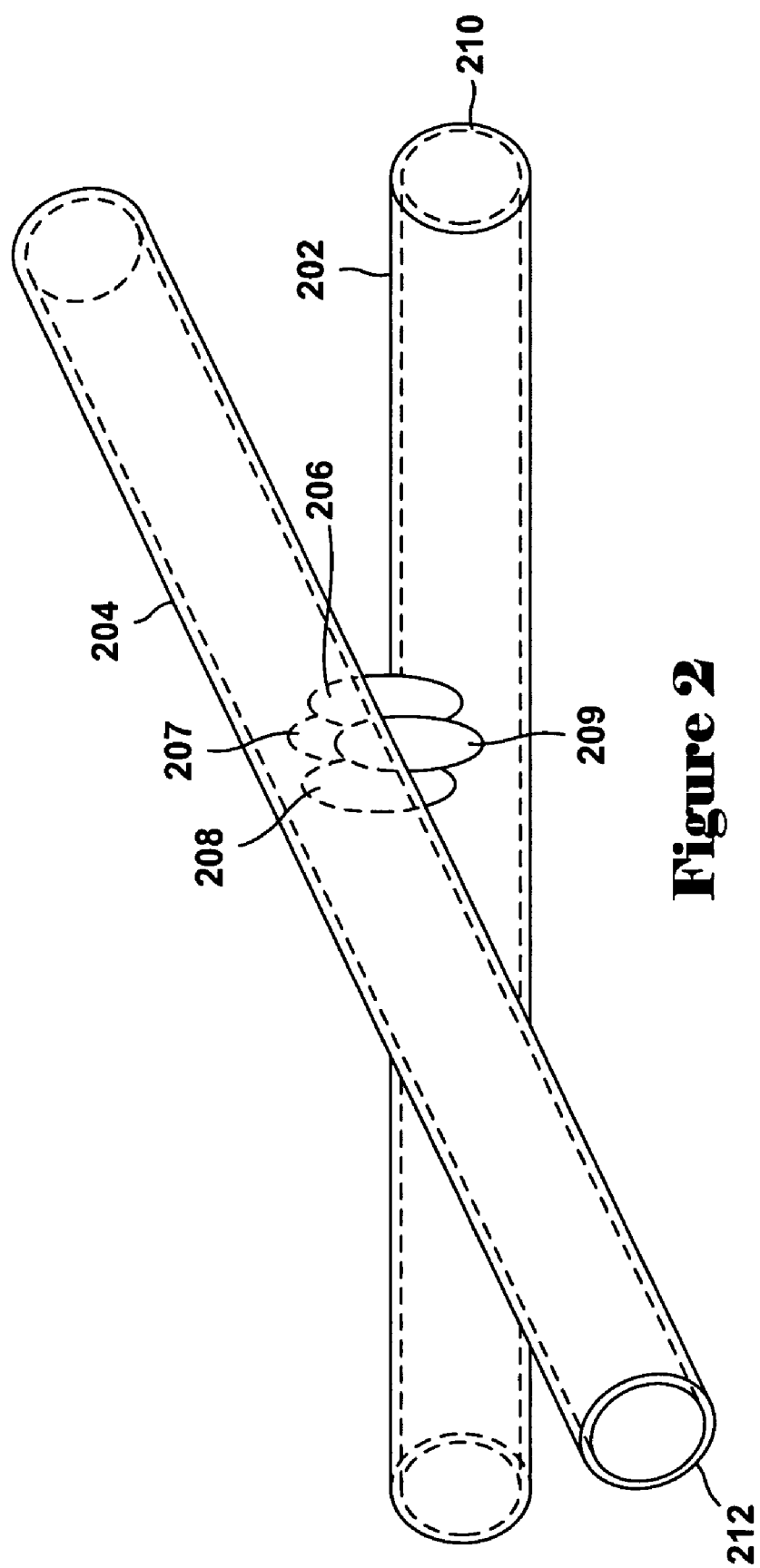
FIG. 2 illustrates a nanowire junction, or intersection, between two roughly orthogonal nanowires.

Nanowire crossbars are not only layers of relatively parallel conductive elements, but may also be used to create arrays of nanoscale electronic components, such as transistors, diodes, resistors, and other familiar basic electronic components. FIG. 2 illustrates a nanowire junction between nanowires of two contiguous layers within a nanowire crossbar. In FIG. 2, the nanowire junction between a first nanowire 202 of a first nanowire layer intersects a second nanowire 204 of a second nanowire layer. Note that the nanowire junction may or may not involve physical contact between the two nanowires 202 and 204. As shown in FIG. 2, the two nanowires are not in physical contact at their closest point of approach, but the gap between them is spanned by a small number of molecules 206–209. Various different types of molecules may be introduced at nanowire junctions for a variety of different purposes. In many cases, the molecules of a nanowire junction may be accessed, for various purposes, through different voltage levels or current levels placed on the nanowires forming the nanowire junction. The molecules spanning the nanowire junction in FIG. 2 may have various different quantum states in which the molecules exhibit resistive, semiconductor-like, or conductive electrical properties. The current passing between the two nanowires intersecting at a nanowire junction may be a nonlinear function of the voltage across the nanowire junction as a result of quantum-mechanical tunneling of electrons through relatively low-energy, unoccupied quantum states of the molecules. The quantum states, and relative energies of quantum states, of the molecules may be controlled by applying differential currents or voltages to the nanowires forming the interaction. For example, molecules may be conductive in a reduced state, but may act as insulators in an oxidized state, with redox reactions controlled by voltage levels determining which of the quantum states the molecules inhabit.

In general, a nanowire junction is anisotropic, having a polarity or direction with respect to physical properties, including electrical properties. This anisotropy may arise from different chemical and/or physical properties of nanowires in the two layers of a nanowire crossbar, may arise from asymmetries of nanowire junction molecules combined with nanowire junction molecules being uniformly oriented with respect to the nanowire layers, and may arise both from differences in the properties of the nanowires as well as nanowire-junction-molecule asymmetries. The fact that nanowire junctions may have polarities allows for controlling nanowire junction properties by applying positive and negative voltages to nanowire junctions, eliciting forward and reverse currents within the nanowire junctions.

As shown in FIG. 2, the nanowires may include outer coatings, such as outer coatings 210 and 212. The outer coatings may serve to insulate nanowires from one another, may constitute the molecules that serve to span nanowire junctions when the nanowires are placed in contact with one another, or may serve as modulation-dopant-layers, which can be selectively activated to dope semiconductor nanowires. Both p-type and n-type modulation dopant coatings have been developed. In other applications, the molecules spanning nanowire junctions between crossing nanowires may be introduced as a separate layer formed between layers of nanowires. In some cases, the state changes of nanowire-junction molecules may not be reversible. For example, the nanowire-junction molecules may initially be resistive, and may be made conductive through application of relatively high voltages. In other cases, the nanowire-junction molecules may be conductive, but the molecules may be irreversibly damaged, along with portions of the nanowires proximal to the nanowire junctions, through application of very high voltage levels, resulting in disrupting conductivity between the two nanowires and breaking electrical connection between them. In yet other cases, the nanowire-junction molecules may transition reversibly from one state to another and back, so that the nanoscale electrical components configured at nanowire junctions may be reconfigured, or programmed, by application of differential voltages to selected nanowire junctions.

Figure 3A:
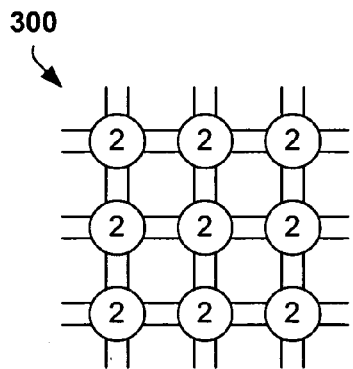
FIGS. 3A–3D illustrates one possible approach for configuring a network of nanoscale electrical components from a two-layer nanowire crossbar.
Figure 3B:
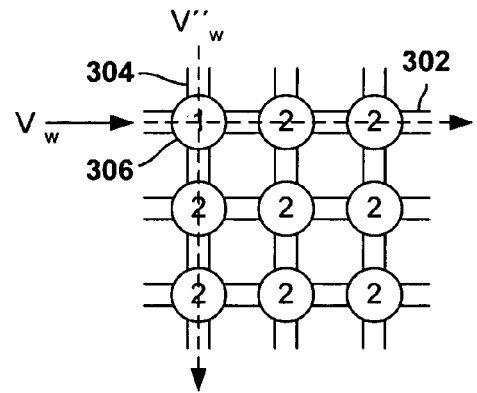
Figure 3C:
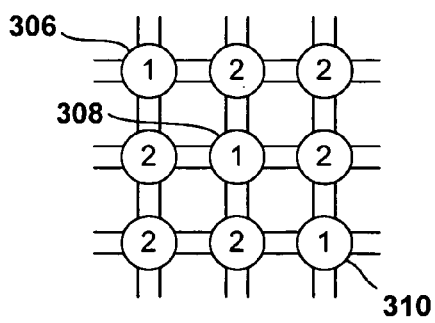
Figure 3D:
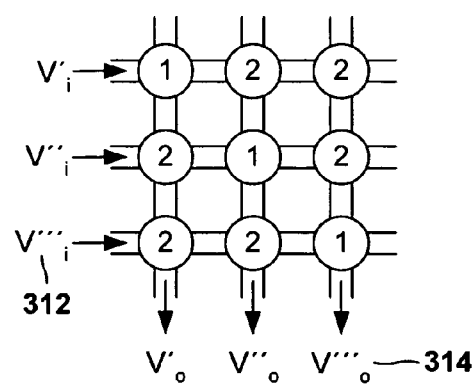

FIGS. 3A–3D illustrate one possible approach to configuring a network of reconfigurable nanoscale electrical components from a two-layer nanowire crossbar. In FIGS. 3A–3D, a small 3×3 nanowire crossbar is shown, with circles at all nine nanowire junctions indicate the state of the nanowire-junction molecules. In one state, labeled "1" in FIGS. 3A–3D, the nanowire-junction molecules may have certain semiconductor, or conductive properties, while in a second state, labeled "2" in FIGS. 3A–3D, nanowire-junction molecules may have different properties. Initially, as shown in FIG. 3A, the states of the nanowire junctions of the nanowire crossbar 300 are in the state labeled "2." Next, as shown in FIG. 3B, each nanowire junction may be uniquely accessed by applying a write voltage, or configuring voltage, to the nanowires that form the nanowire junction in order to configure, or program, the nanowire junction to have the state "1." For example, in FIG. 3B, a first write voltage $v_w"$ is applied to horizontal nanowire 302 and a second write voltage $v_w"$ is applied to vertical nanowire 304 to change the state of the nanowire junction from "2" to "1." Individual nanowire junctions may be configured through steps similar to the steps shown in FIG. 3B to finally result in a fully configured nanoscale component network as shown in FIG. 3C. Note that, in FIG. 3C, the states of nanowire junctions 306, 308, and 310 that form a downward-slanted diagonal through the nanowire crossbar have been configured by selective application of write voltages. Finally, as shown in FIG. 3D, the nanoscale electrical component network can be used as a portion of an integrated circuit. Input voltages $v_i'$, $v_i"$, and $v_i'''$ may be applied to the nanoscale electrical component lattice as inputs 312 and output voltages $v_o'$, $v_o"$, and $v_o'''$ 314 may be accessed as the result of operation of the nanoscale electrical component network that represents a portion of an integrated circuit. In general, the input and output voltages $v_i'$, $v_i"$, and $v_i'''$ and $v_o'$, $v_o"$, and $v_o'$ relatively low magnitudes compared with the write voltages $v_w$. Depending on the types of nanowires, types of dopants employed in the case of semiconductor nanowires, and the types of nanowire-junction molecules employed in the nanowire crossbar, many different, but similar configuring processes may be used to configure nanowire crossbars into nanowire-based electrical components networks. The example of FIG. 3 is meant to illustrate a general process by which nanowire crossbars may be configured as useful portions of electronic circuits.

Figure 4A:
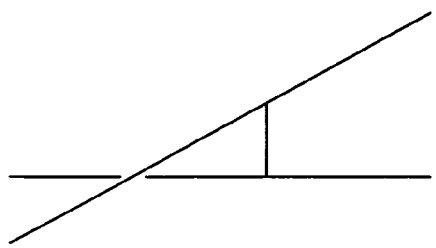
FIG. 4 schematically illustrates a number of simple electrical components that can be programmed at the nanowire junctions of nanowires in nanowire crossbars.
Figure 4B:
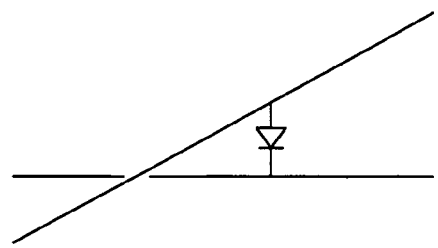
Figure 4C:
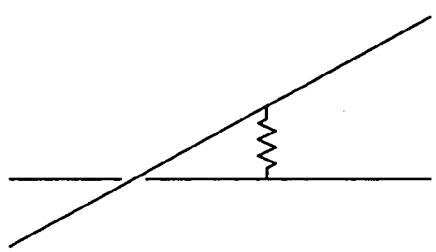
Figure 4D:
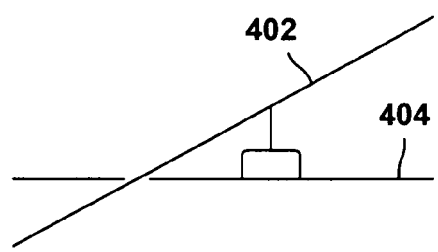
Figure 4E:
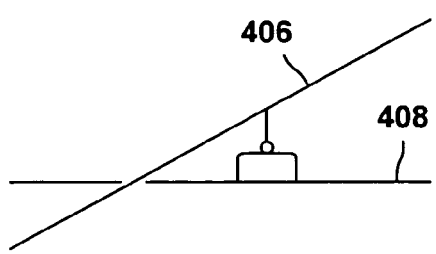
Figure 4F:
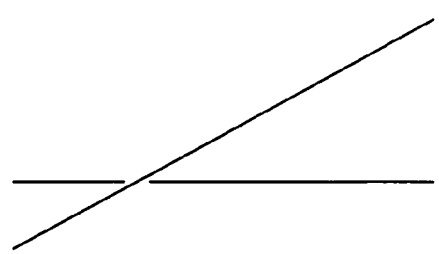

Nanowire junctions of nanowires in nanowire crossbars may be configured, in various techniques depending on the chemical nature of the nanowires and nanowire-junction-spanning molecules, to form a wide variety of different, simple electronic devices. FIG. 4 schematically illustrates a number of simple electrical components that can be configured at the nanowire junctions of nanowires in nanowire crossbars. A nanowire junction may represent (1) a simple conductive connection between the two nanowires, as shown in FIG. 4A; (2) a diode that conducts current in only one direction between the two nanowires, as shown in FIG. 4B; (3) a resistor, with the magnitude of resistance configurable by application of different configuring voltages, as shown in FIG. 4C; (4) a negatively doped field-effect transistor ("nFET"), as shown in FIG. 4D; (5) a positively doped field-effect transistor ("pFET"), as shown in FIG. 4E; and (6) the crossing of two conductive nanowires, with the voltage and current associated with each nanowire completely independent from one another, as shown in FIG. 4F. In the case of the nFET, shown in FIG. 4D, a relatively low voltage state on the gate wire 402 results in current passing through the source/drain wire 404, while a relatively high voltage on the gate wire 402 prevents conduction of current on the source/drain nanowire 404. The pFET of FIG. 4E exhibits opposite behavior, with a relatively high voltage on the gate wire 406 facilitating flow of current through the source/drain wire 408, and relatively low voltage on the gate wire 406 preventing the flow of current on the source/drain wire 408. Note also that a nanowire junction may also be configured as an insulator, essentially interrupting conduction at the nanowire junction with respect to both nanowires. Thus, as discussed above with reference to FIGS. 1–4, a two-dimensional nanowire crossbar may be constructed and then configured as a network of electrical components. Note also that a nanowire junction, although shown in FIGS. 4A–F to comprise the nanowire junction of two single nanowires, may also comprise a number of nanowire junctions between a number of wires in a first layer of a nanowire crossbar that together comprise a single conductive element and the nanowires in a second nanowire layer that together comprise a second conductive element.

The configurable electrical resistance of nanowire junctions is an important and special property of certain types of nanowire junctions. When certain types of molecules are used for nanowire junctions, the initially relatively high resistance of the nanowire junction may be lowered by applying a relatively large positive voltage to the nanowire junction. The resistance of the nanowire junction can be a function of the magnitude of the highest voltage applied to the nanowire junction. By applying higher and higher positive voltages to a nanowire junction, the resistance of the nanowire junction can be made lower and lower. A relatively low resistance state achieved by application of a positive voltage may be reversed by applying a sufficiently high, negative voltage. Thus, not only is the electrical resistance of a nanowire junction configurable, the electrical resistance may also be reconfigurable, depending on the type of molecules forming the nanowire junction.

Figure 5:
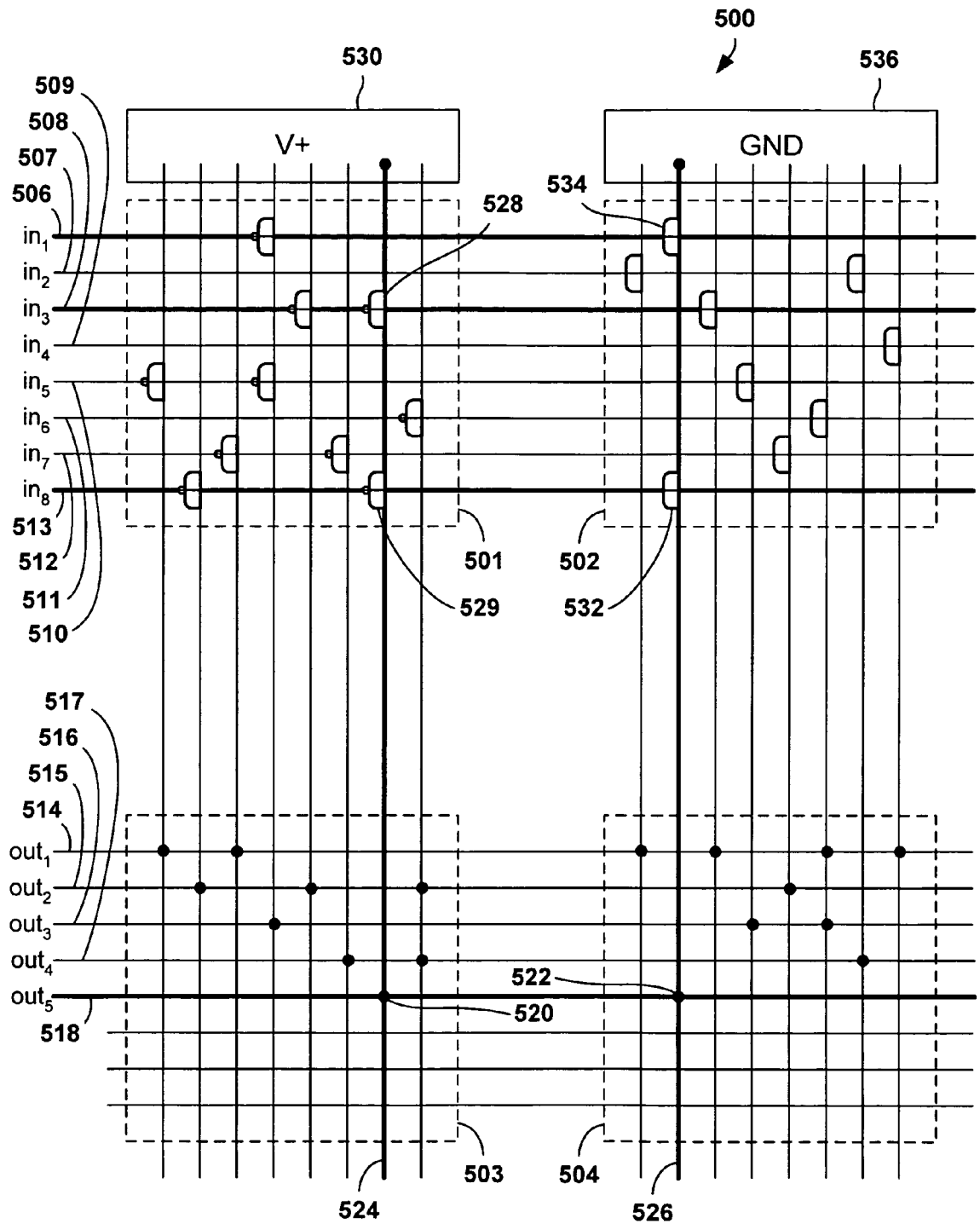
FIG. 5 illustrates an exemplary two-layer CS lattice.

A particularly useful type of nanoscale electronic component array based on nanowire-crossbar technology is referred to as a "complementary/symmetry lattice" ("CS lattice"). FIG. 5 illustrates an exemplary CS lattice. Note that, although CS lattices are generally configured to represent logical and useful circuits, the CS lattice in FIG. 5 is rather arbitrarily configured, and is shown not as a representation of a particular subcircuit implemented by the CS lattice, and may not even be useful or functional, but rather is included to show the basic features of the CS lattice itself. In general, because of the small scales of the nanowire-crossbar grids, it is difficult to chemically alter individual nanowire junctions. Techniques do exist for applying a very small number of molecules to a particular nanowire junction, but the techniques are painstakingly time consuming, and unsuitable for mass production. However, it is currently relatively straightforward to chemically alter subregions or microregions, comprising a number of nanowire junctions using currently available semiconductor manufacturing technologies. The term "microregion" is meant to indicate a scale larger than an individual nanowire junction, but not necessarily a particular range of dimensions. It is currently technically feasible to fabricate sub-micron-sized microregions, for example. In the exemplary CS lattice shown in FIG. 5, four distinct, square microregions, demarcated by dashed lines 501–504, are shown within the nanowire crossbar 500. Microregion 501 is chemically altered so that nanowire junctions within microregion 501 may be selectively configured as pFET components. Conversely, microregion 502 has been chemically altered so that nanowire junctions within microregion 502 may be selectively configured as NFET components. The microregions 503 and 504 have been chemically configured so that nanowire junctions within microregions 503 and 504 can be selectively configured as conductive links that electrically connect the nanowires forming the nanowire junctions. In certain embodiments, one set of parallel wires, the horizontal, conductive nanowires in FIG. 5, may be of nanoscale dimensions or of greater, sub-microscale or microscale dimensions, while the other set of parallel wires, the vertical semiconductive nanowires in FIG. 5, can be of nanoscale or microscale dimensions.

In a CS lattice, some number of nanowires is considered as a set of molecular input-signal lines. For example, in the CS lattice shown in FIG. 5, horizontal nanowires 506–513 are considered as inputs, and labeled "$in_1$"–"$in_8$." Similarly, a distinct set of wires is normally considered as a set of molecular output-signal lines. For example, in the CS lattice shown in FIG. 5, horizontal nanowires 514–518 are considered as molecular output-signal lines, and designated in FIG. 5 as "$out_1$"–"$out_5$." Consider, for example, molecular output-signal line, or horizontal nanowire, "$out_5$" 518. Proceeding along nanowire "out5" 518 from left to right, it can be seen that molecular output-signal line "$out_5$" is connected via nanowire junction connections 520 and 522, denoted by small circles in the nanowire junctions, to vertical nanowires 524 and 526, respectively. Traversing these vertical nanowires 524 and 526, it can be seen that vertical nanowire 524 is connected with molecular input-signal line "$in_3$" 508 via a pFET 528 and connected with molecular input-signal line "$in_8$" 513 via a pFET 529. Thus, when molecular input-signal lines "$in_3$" 508 and "$in_8$" 513 are low, the pFETs 528 and 529 are activated to connect molecular output-signal line "$out_5$" with a high voltage source 530, potentially driving molecular output-signal line "$out_5$" to a high-voltage state. However, following vertical nanowire 526 upwards from the connection 522 to molecular output-signal line "$out_5$" 518, it can be seen that the vertical nanowire 526 interconnects with molecular input-signal line "$in_8$" 513 via a NFET 532 and interconnects with molecular input-signal line "$in_1$" 506 via nFET 534. Whenever molecular input-signal lines "$in_1$" and "$in_8$" are both in a high-voltage state, then the nFETs 532 and 534 are activated to interconnect the vertical nanowire 526 with ground 536, essentially shorting vertical nanowire 526 and molecular output-signal line "$out_5$" 518 to ground. When molecular input-signal lines "$in_1$" and "$in_8$" are high molecular output-signal line "$out_5$" 518 is low. When both of molecular input-signal lines "$in_1$" and "$in_8$" are low, and molecular input-signal line "$in_3$" is high, then molecular output-signal line "$out_5$" is undriven, and in a high impedance state. Thus, the state of molecular output-signal line "$out_5$" 518 depends only on the states of molecular input-signal lines "$in_1$," "$in_3$," and "$in_8$," and a truth table summarizing the response of molecular output-signal line to all possible input-signal-line-states can be provided as follows:

| $in_1$ | $in_3$ | $in_8$ | $out_5$ |
|---|---|---|---|
| 0 | 0 | 0 | 1 |
| 0 | 0 | 1 | high Z |
| 0 | 1 | 0 | high Z |
| 0 | 1 | 1 | high Z |
| 1 | 0 | 0 | 1 |
| 1 | 0 | 1 | 0 |
| 1 | 1 | 0 | high Z |
| 1 | 1 | 1 | 0 |

Various different types and sizes of CS lattices are possible. The configuration of CS lattices is constrained only by the fact that there is a minimum area of a nanowire crossbar to which discrete types of chemically modifying agents can be applied, by direct deposit, by photolithographic methods, or by other methods. Thus, CS lattices comprise blocks of sublattices, or microregions, within which one or a small number of different types of nanoscale electrical components can be selectively created at nanowire junctions.

While a brief introduction to nanowire lattices has been provided, above, more detailed information is available in a number of patent applications and issued patents. Additional information may be obtained from: Kuekes, et al., U.S. Pat. No. 6,314,019B1; Kuekes, et al., U.S. Pat. No. 6,256,767B1; Kuekes, et al., U.S. Pat. No. 6,128,214; and Snider, et al., published U.S. Patent Application No. 2004-0041617, Mar. 4, 2004.

EMBODIMENTS OF THE PRESENT INVENTION

Various embodiments of the present invention are directed to methods for designing multilayer nanowire crossbars that are functionally equivalent to two-layer nanowire crossbars. Multilayer nanowire crossbar designs are based on conceptually folding two-layer nanowire-crossbar designs between microregions and collapsing folded nanowires into shorter length nanowires. In multilayer nanowire crossbars, the shorter length nanowires may lead to lower power dissipation and reduced electrical current propagation time than in functionally equivalent, two-layer nanowire crossbars because of the shorter average length of nanowire used to carry electrical signals between nanowire junctions.

Embodiments of the present invention can be used to design one or more multilayer lattices based on a single two-layer lattice design. FIGS. 6–12 illustrate two of many possible ways to obtain multilayer lattice designs that are based on a functionally equivalent two-layer nanowire-crossbar design that implements a mathematical function.

Figures 6A, 6B:
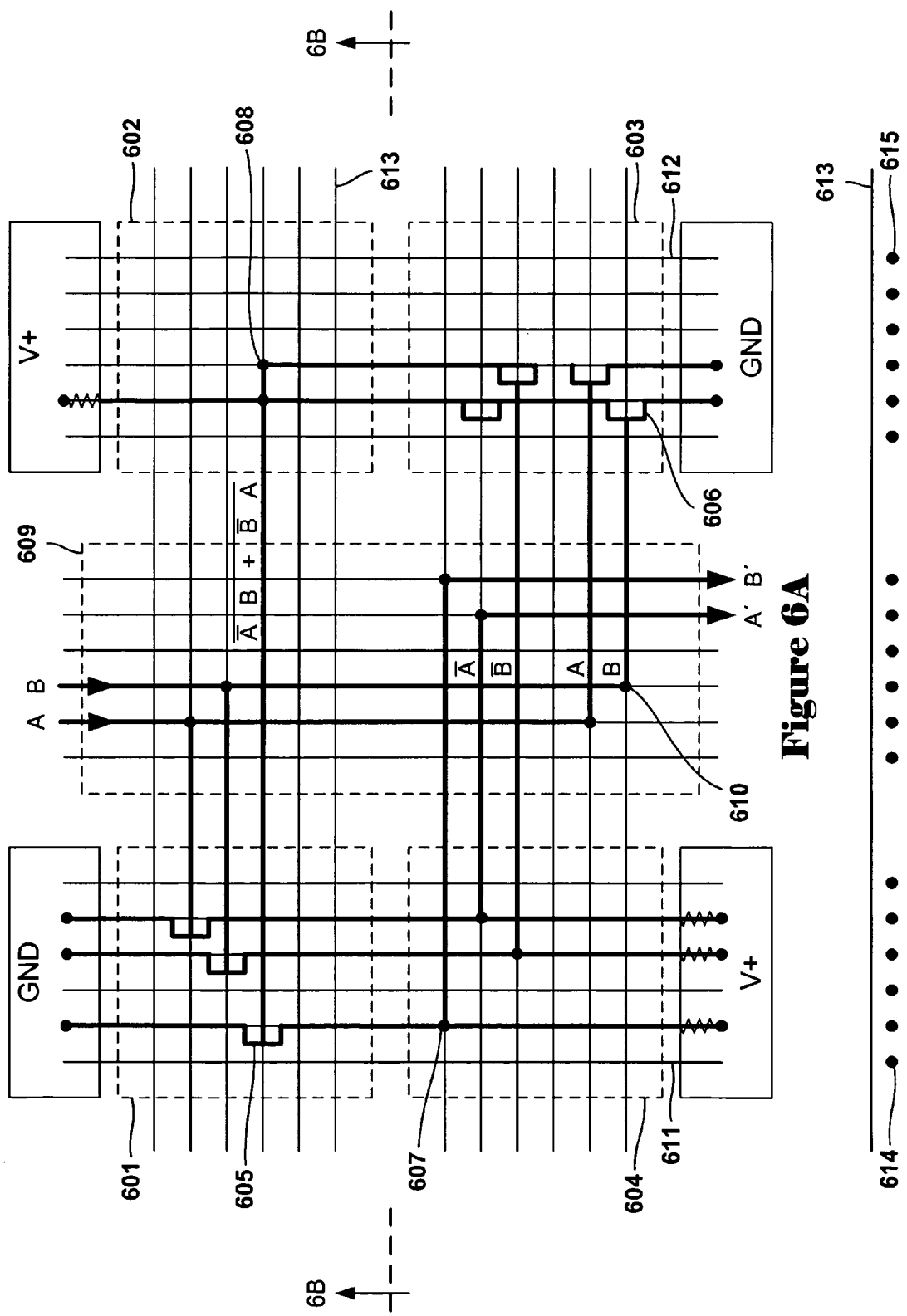
FIG. 6A illustrates a two-layer lattice design that is configured to implement a mathematical modulo 4 incrementer.
FIG. 6B illustrates a cross-sectional view of the two-layer lattice, shown in FIG. 6A.

FIG. 6A illustrates a two-layer lattice design that is configured to implement mathematical modulo "4" incrementer. In FIG. 6A four microregions 601–604, demarcated by dashed lines, are shown within the nanowire crossbars. Microregions 601 and 603 are chemically altered so that nanowire junctions within microregions 601 and 603 can be selectively configured as nFET components. For example, components 605 and 606 represent NFET nanowire junctions. Microregions 602 and 604 are chemically altered so that nanowire junctions within microregions 602 and 604 can be selectively configured as conductive links that electrically connect crossing nanowires. For example, components 607 and 608 represent conductive links located within microregions 603 and 602, respectively. Intermediate microregion 609, demarcated by dashed lines, is chemically altered so conductive links, such as conductive link 610, can be configured. In FIG. 6A, vertical nanowires extend below voltage sources and grounds, such as vertical nanowires 611 and 612, and horizontal nanowires, such as horizontal nanowire 613, and can be connected to other electronic devices.

FIG. 6B illustrates cross-sectional view of the two-layer lattice, shown in FIG. 6A. In FIG. 6B, the cross-sectional view I shows three groups of six points located below horizontal nanowire 613. The points identify the cross sections of the vertical nanowires shown in FIG. 6A. For example, points 614 and 615 represent the cross-sectional view of vertical nanowires 611 and 612, respectively. The rest of the horizontal wires in microregions 601 and 602 are located behind horizontal nanowire 613 and are not shown.

Figure 7A:
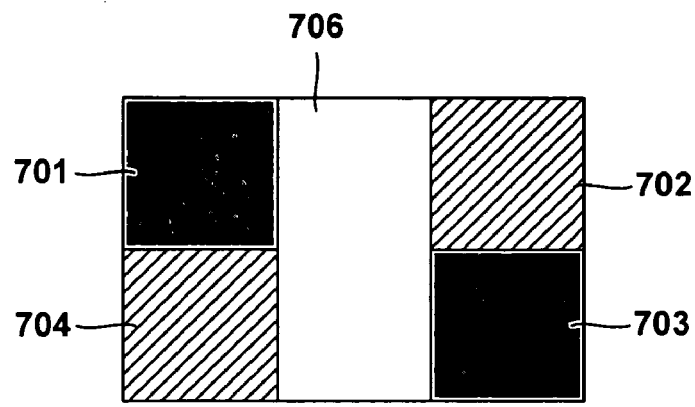
FIGS. 7A–7D illustrate one of many possible embodiments according to the present invention of conceptually folding the two-layer lattice design, shown in FIGS. 6A–6B.
Figure 7B:
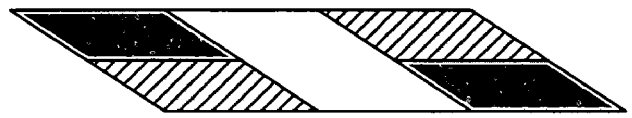
Figure 7C:
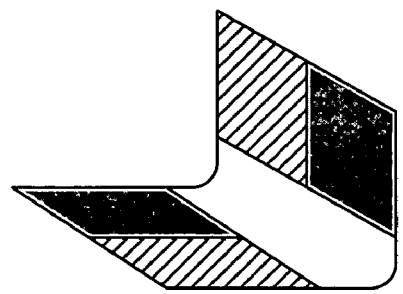
Figure 7D:
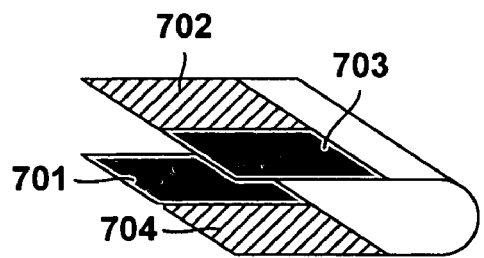

FIGS. 7A–7D illustrate one of many possible embodiments according to the present invention of conceptually folding the two-layer lattice design, shown in FIGS. 6A–6B. FIG. 7A illustrates a schematic representation of the two-layer lattice, shown in FIG. 6A. Shaded regions 701 and 703 represent microregions 601 and 603, respectively, hash-marked regions 702 and 704 represent microregions 602 and 604, respectively, and unshaded region 706 represents intermediate microregion 609. FIG. 7B illustrates a perspective view of the schematic representation shown in FIG. 7A. FIG. 7C–D illustrate a perspective view of conceptual folding the two-layer lattice shown in FIG. 7B within the unshaded region 706. Note that, in FIG. 7D, the two-layer lattice design is folded so that hash-marked region 702 is located directly above shaded region 701, and shaded region 703 is located directly above hash-marked region 704.

Figure 8A:
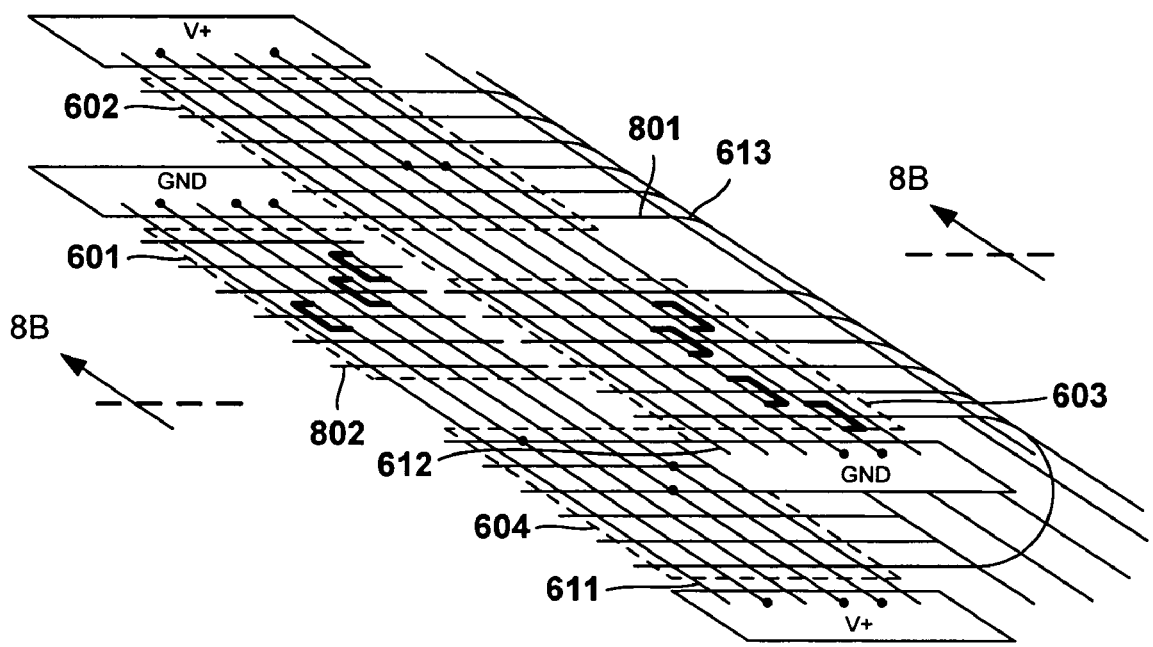
FIG. 8A illustrates a perspective view of the conceptually folded two-layer lattice design, shown in FIG. 6A, according to the method described above with reference to FIGS. 7A–7D.

FIG. 8A illustrates a perspective view of the conceptually folded two-layer lattice design, shown in FIG. 6A, according to the method described above with reference to FIGS. 7A–7D. The two-layer lattice design is folded so that microregion 601 is parallel to microregion 602, and microregion 604 is parallel to microregion 603. Moreover, the vertical nanowires in microregions 602 and 603 are parallel to, and located directly above, the vertical nanowires in microregions 601 and 604. For example, vertical nanowire 612 is parallel to, and located directly above, vertical nanowire 611. Note that conceptual folding of the horizontal nanowires gives U-shaped nanowires having parallel, straight wire segments. For example, nanowire segments 801 and 802 of U-shaped nanowire 613 are parallel. Note also that the surface area needed to accommodate the folded, two-layer lattice design is nearly one-half the surface area needed to accommodate the unfolded, two-layer lattice design, shown in FIG. 6A.

Figure 8B:
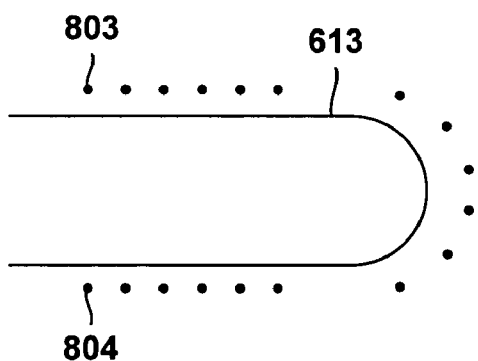
FIG. 8B illustrates a cross-sectional view of the folded two-layer lattice design, shown in FIG. 8A.

FIG. 8B illustrates cross-sectional view of the folded two-layer lattice design, shown in FIG. 8A. In FIG. 8D, the points located around the exterior of U-shaped nanowire 613 identify the cross sections of vertical nanowires. For example, points 803 and 804 identify the cross sections of vertical nanowires 611 and 612, shown in FIG. 8A.

Figure 9A:
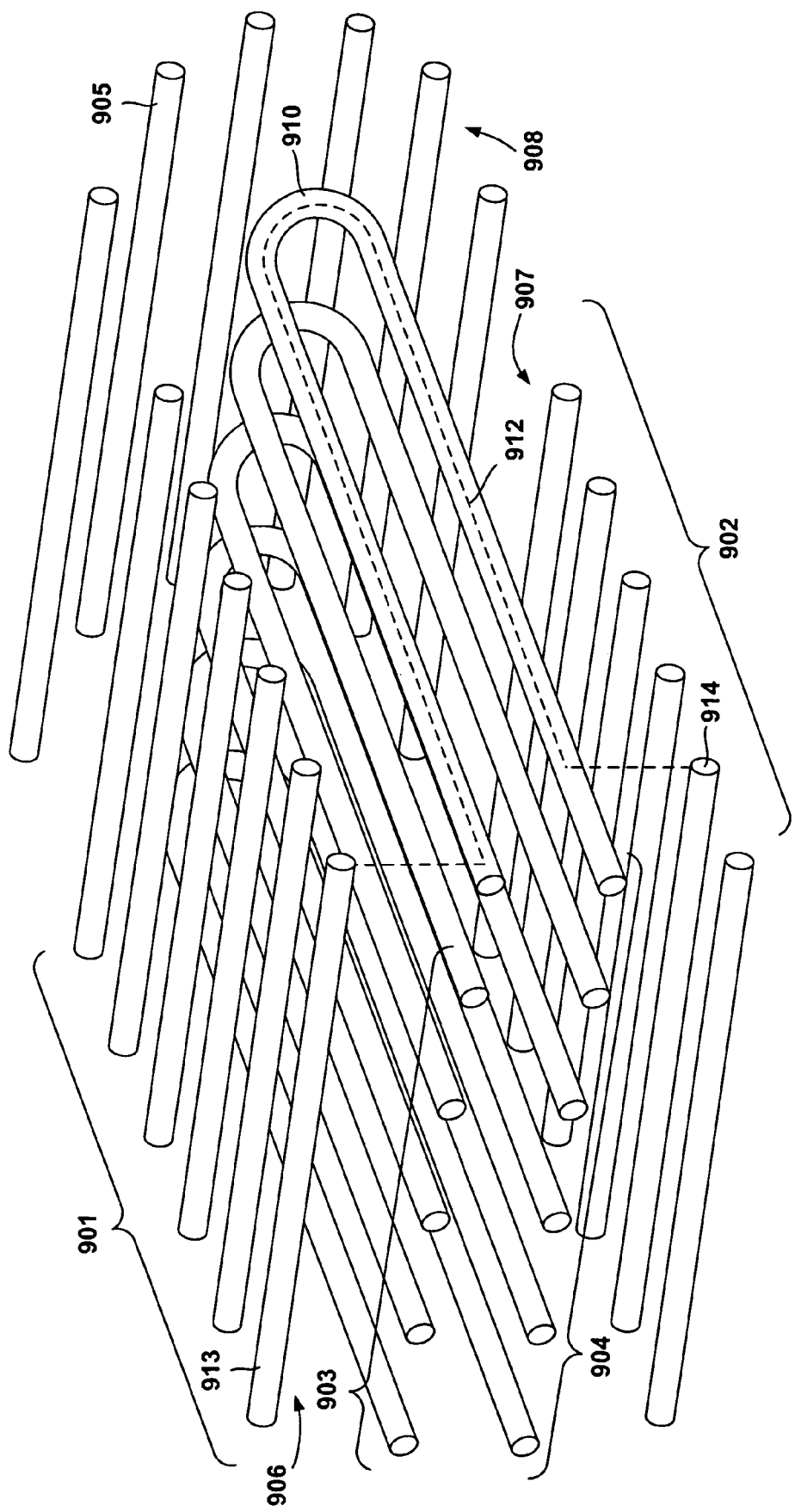
FIGS. 9A–9B illustrate conceptually collapsing the U-shaped nanowires, shown in FIGS. 8A–8B.
Figure 9B:
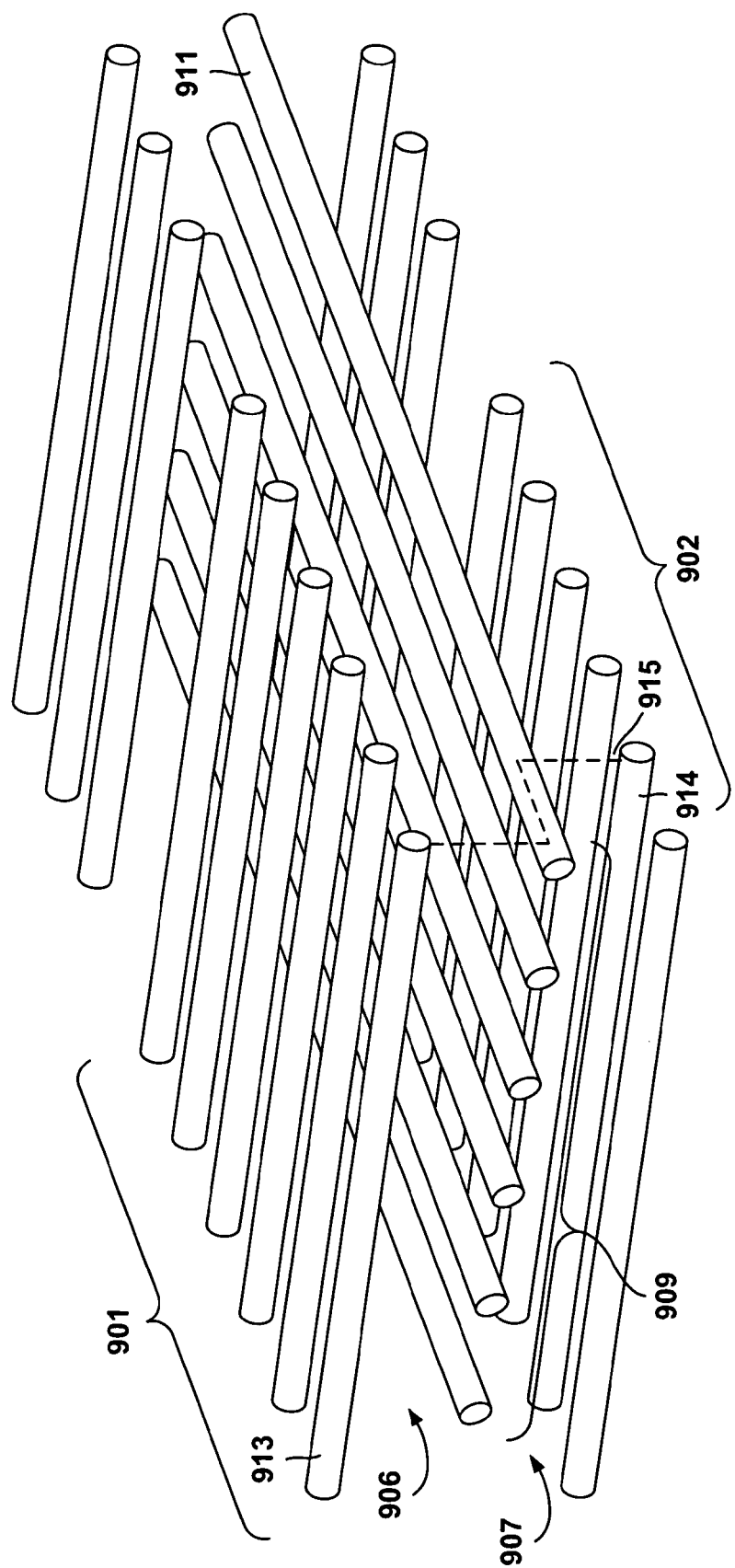

FIGS. 9A–9B illustrate conceptually collapsing the U-shaped nanowires, shown in FIGS. 8A–8B, into straight horizontal nanowires. Note that nanowire junctions displayed in FIGS. 6A and 8A are not displayed in FIG. 9A–9B.

FIG. 9A illustrates an enlarged perspective view of microregions 603 and 604, shown in FIG. 8A. Top nanowire plane 901 is composed of segments of the vertical nanowires located in microregion 603, and bottom nanowire plane 901 is composed of segments of the vertical nanowires located in microregion 604. Intermediate nanowire planes 903 and 904 are composed of the straight horizontal nanowire segments of the U-shaped nanowires, as described above with reference to FIG. 8A. Note that vertical nanowires located in microregion 609, shown in FIG. 6A, are represented by vertical nanowire segments distributed about the curved portion of the U-shaped horizontal nanowires. For example, vertical nanowire segment 905 is a segment of a vertical nanowire in region 609, shown in FIG. 6A. Region 906, between planes 901 and 903, is filled with the chemical species used to configure nFETs. Region 907, between planes 902 and 904, and curved region 908 are filled with the chemical species used to configure conductive link nanowire junctions.

Next, the U-shaped nanowires are collapsed into a single plane of nanowires without reducing the number of nanowire junctions. FIG. 9B illustrates a perspective view of the folded nanowire perspective view, shown in FIG. 9A, after the U-shaped horizontal nanowires have been collapsed into horizontal nanowire plane 909. For example, U-shaped nanowire 910, shown in FIG. 9A, is collapsed into horizontal nanowire 911.

Note that collapsing the U-shaped nanowires into shorter length horizontal nanowires does not reduce the number of nanowire junctions. Note also that the length of nanowire needed to construct the multilayer two-layer lattice segment is less than the length of nanowire needed to construct the functionally equivalent two-layer lattice segment. For example, U-shaped nanowire 910, shown in FIG. 9A, is longer than horizontal nanowire 911, shown in FIG. 9B. The reduced nanowire length leads to shorter average connections between nanowire junctions. For example, in FIG. 9A, dashed line 912 identifies a hypothetical current path an electrical signal flows between vertical nanowires 913 and 914, assuming the existence of nanowire junctions connecting nanowires 913 and 914 to U-shaped horizontal nanowire 910. By contrast, in FIG. 9B, dashed line 915 identifies a hypothetical current path between vertical nanowires 913 and 914 that is shorter than path 912.

Figure 10A:
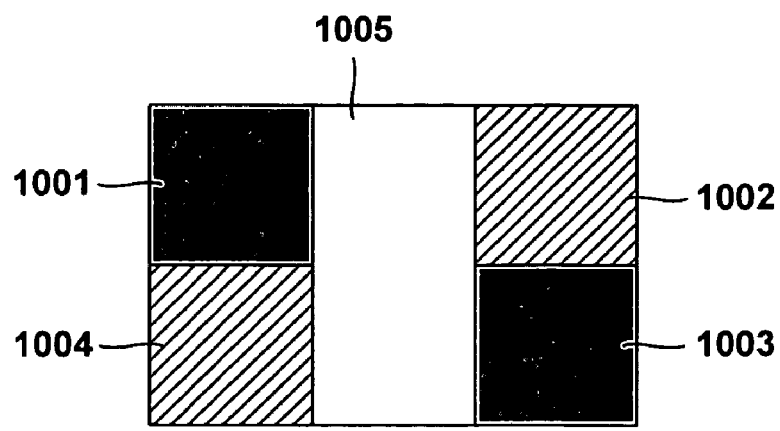
FIGS. 10A–10D illustrate an alternate embodiment of conceptually folding the two-layer lattice design, shown in FIGS. 6A–6B, that is different from the conceptually folding method described above with reference to FIGS. 7A–7B.
Figure 10B:
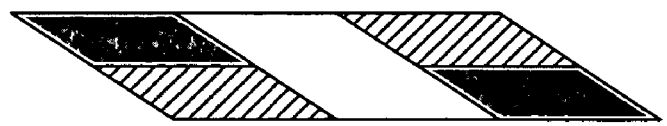
Figure 10C:
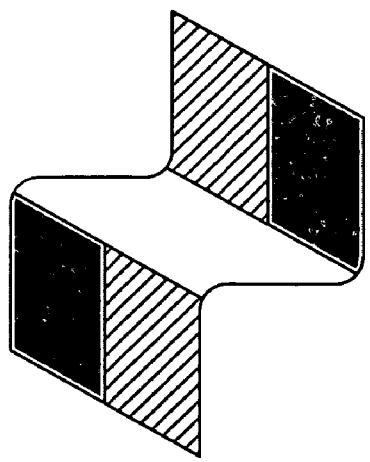
Figure 10D:
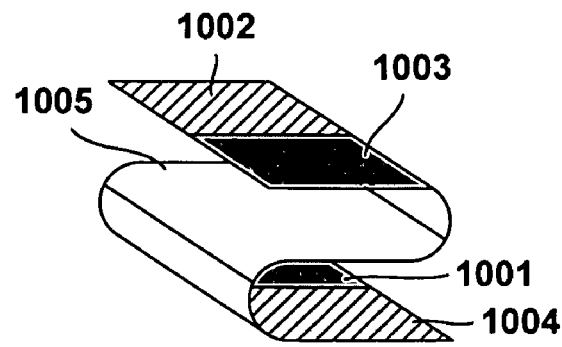

FIGS. 10A–10D illustrate an alternate embodiment of conceptually folding the two-layer lattice design, shown in FIGS. 6A–6B, that is different from the conceptually folding described above with reference to FIGS. 7A–7B. FIG. 10A illustrates a schematic representation of the two-layer lattice, shown in FIG. 6A, and is identical to FIG. 7A. Shaded regions 1001 and 1003 represent microregions 601 and 603, respectively, hash-marked regions 1002 and 1004 represent microregions 602 and 604, respectively, and unshaded region 1006 represents intermediate region 609. FIG. 10B illustrates a perspective view of the schematic representation shown in FIG. 10A. FIG. 10C–D illustrate conceptual folding of the perspective view of the two-layer lattice shown in FIG. 10B between unshaded region 1006 and regions 1002 and 1003, and between unshaded region 1006 and regions 1001 and 1004. Note that, in FIG. 10D, the two-layer lattice design is folded so that hash-marked region 1002 is located above shaded region 1001, and shaded region 1003 is located above hash-marked region 1004, as described above with reference to FIG. 7A–7D, however, unshaded region 1005 is located between upper regions 1002 and 1003 and lower regions 1001 and 1004.

Figure 11A:
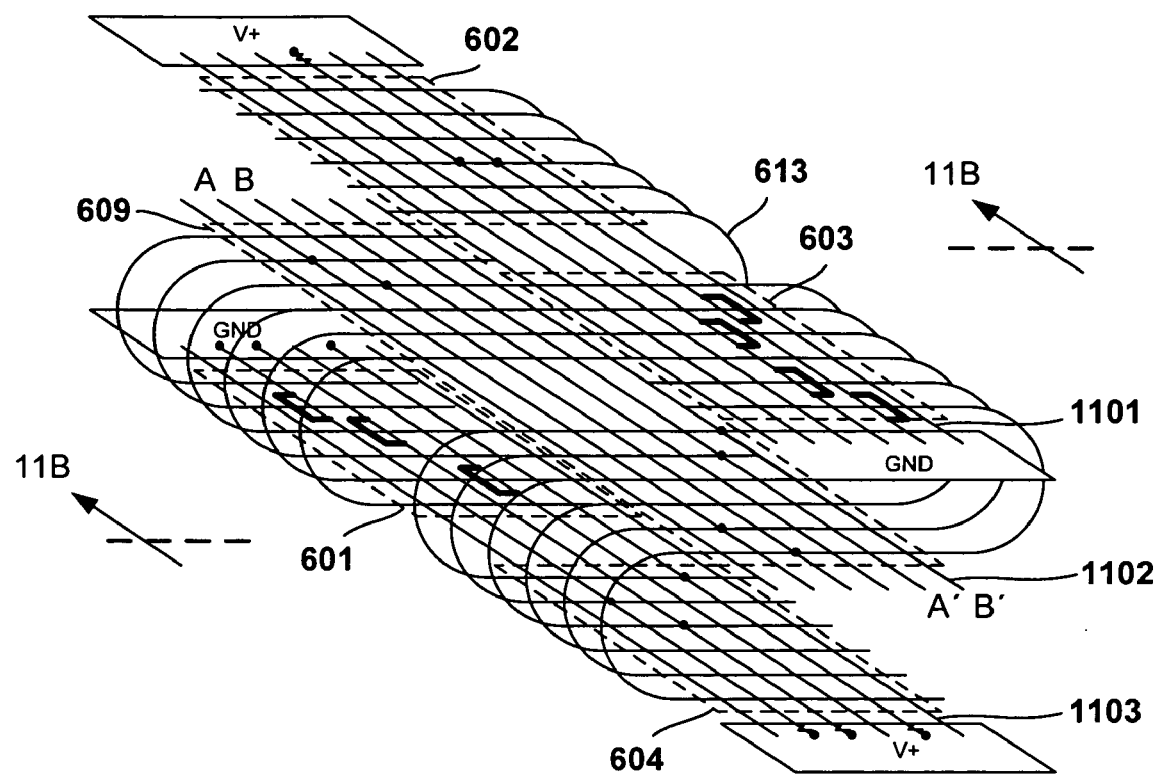
FIG. 11A illustrates a perspective view of the conceptual folded two-layer lattice design, shown in FIG. 6A, according to the method described above with reference to FIGS. 10A–10D.

FIG. 11A illustrates a perspective view after conceptual folding of the two-layer lattice design, shown in FIG. 6A, according to the method described above with reference to FIGS. 10A–10D. The two-layer lattice design is folded so that the microregions are parallel to one another. For example, microregion 602 is located above and parallel to microregion 609, and microregion 609 is located above and parallel to microregion 601. Moreover, the vertical nanowires are located above and parallel to one another, such as vertical nanowires 1101–1103. Note that the surface area needed to accommodate the conceptually folded multilayer lattice design is nearly one-third the total surface area needed to accommodate the unfolded, two-layer lattice design, shown in FIG. 6A.

Figure 11B:
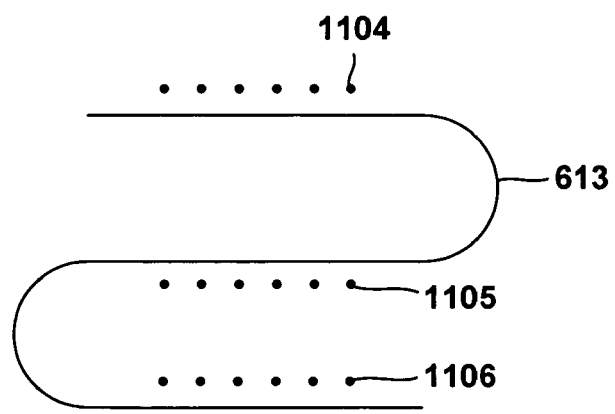
FIG. 11B illustrates a cross-sectional view of the conceptually folded lattice design, shown in FIG. 11A.

FIG. 11B illustrates cross-sectional view of the conceptually folded lattice design, shown in FIG. 11A. In FIG. 11B, the three groups of six points along the straight segments of bent horizontal nanowire 613 identify the cross sections of vertical nanowires. For example, points 1104–1106 are the cross sections of nanowires 1101–1103, respectively.

Figure 12A:
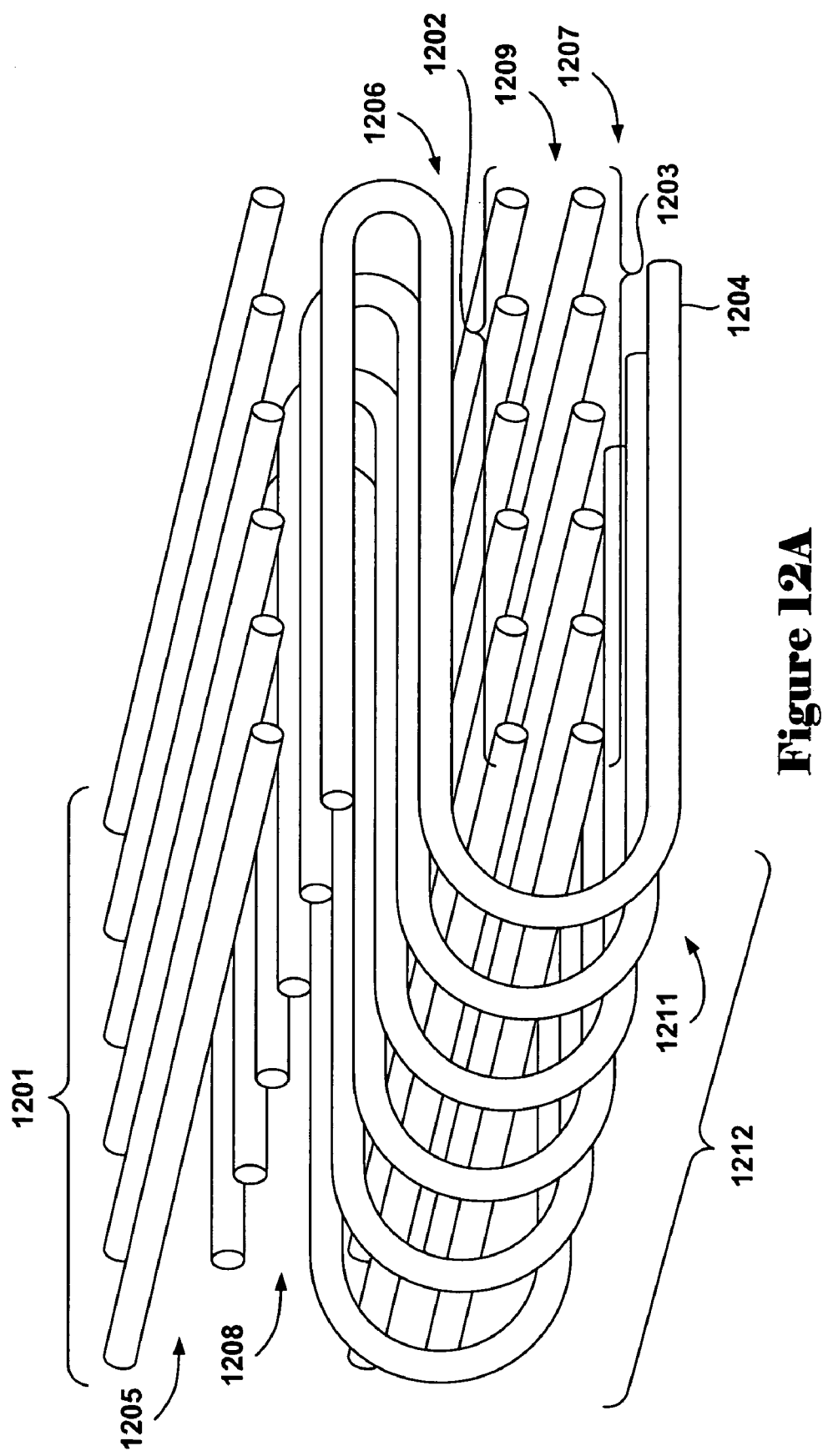
FIGS. 12A–12B illustrate conceptual collapsing of the folded two-layer lattice design, shown in FIG. 11A.

FIG. 12A illustrates a perspective view of microregions 603, 604, and the portion microregion 609 located between microregions 603 and 604, as shown in FIG. 11A. In FIG. 12A, vertical nanowire planes 1201–1203 are composed of segments of the vertical nanowires located in microregions 603, 604, and 609, shown in FIG. 11A. Curved nanowires, such as curve nanowires 1204, represent the horizontal nanowires that have been re-shaped as described above with reference to FIGS. 10A–10D. Region 1205 is filled with the chemical species used to configure nFET nanowire junctions. Regions 1206 and 1207 are filled with the chemical species used to configure conductive nanowire junctions. Both regions 1208 and 1209 are empty.

Figure 12B:
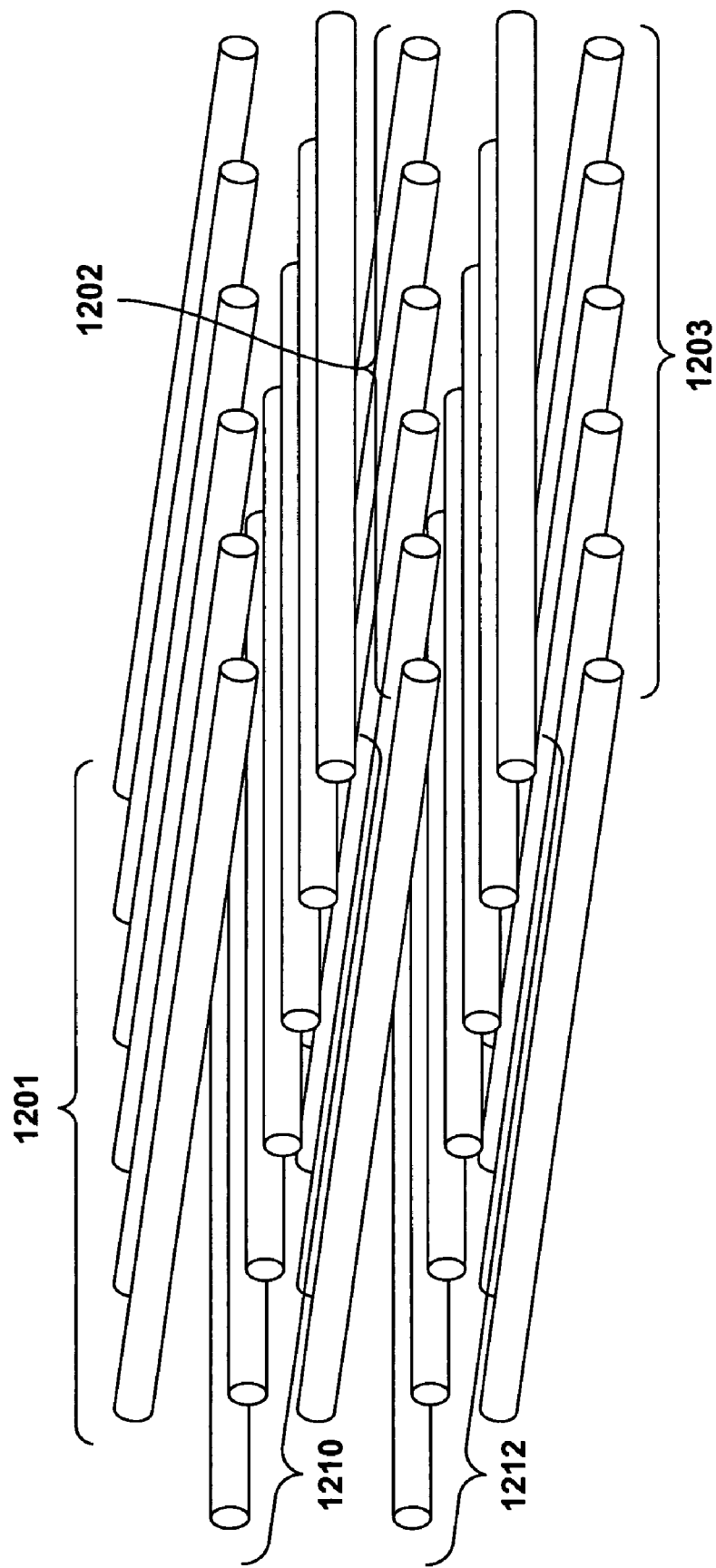

FIG. 12B illustrates a multilayer rearrangement of the folded nanowire configuration shown in FIG. 12A. In FIG. 12B, the U-shaped portion of the curved nanowires located between vertical nanowire planes 1201 and 1202, shown in FIG. 12A, are collapsed into shorter length nanowires, as described above with reference to FIGS. 9A–9B, to give horizontal nanowire plane 1210. The curved portion of bent nanowires, such as curved portion 1211 of bent nanowire 1204, shown in FIG. 12A, is removed and the straight nanowire segments are inserted between vertical nanowire planes 1202 and 1203. In FIG. 12B, horizontal nanowire plane 1212 are the straight nanowire segments inserted between nanowire planes 1202 and 1203.

Although the present invention has been described in terms of a particular embodiment, it is not intended that the invention be limited to this embodiment. Modifications within the spirit of the invention will be apparent to those skilled in the art. For example, an almost limitless number of different two-layer nanowire crossbar lattice designs, such as crossbar lattices having three or more columns of microregions, can be converted to multilayer lattice designs by conceptually folding the two-layer crossbar lattice designs anywhere between the columns of microregions.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. A method for obtaining a multilayer nanowire-crossbar design that is functionally equivalent to a two-layer nanowire crossbars design, the method comprising:
   receiving the two-layer nanowire-crossbar design having two or more microregions;
   folding the two-layer nanowire-crossbar design between the two or more microregions; and
   collapsing folded nanowires into single nanowires, which yields the multilayer nanowire-crossbar design.

2. The method of claim 1 wherein folding the two-layer nanowire-crossbar design between microregions further includes bending horizontal nanowires.

3. The method of claim 2 wherein the bent horizontal nanowires have straight parallel nanowire segments.

4. The method of claim 1 wherein folding the two-layer nanowire-crossbar design between the two or more microregions further includes positioning microregions opposite and parallel to one another.

5. The method of claim 4 wherein positioning microregions opposite and parallel to one another further includes positioning vertical nanowires within oppositely and parallel microregions opposite and parallel to one another.

6. The method of claim 1 wherein collapsing the folded nanowires into shorter nanowires further includes retaining nanowire junctions connecting vertical nanowires and horizontal nanowires.

7. A computer instruction encoded in a computer readable medium for obtaining a multilayer nanowire-crossbar design that is functionally equivalent to a two-layer nanowire crossbars design, the computer instruction comprising:
   logic that receives a first data set corresponding to the two-layer nanowire-crossbar design having two or more microregions;
   logic that folds the two-layer nanowire-crossbar design between the two or more microregions; and
   logic that collapses folded nanowires into single nanowires, which yields a second data set corresponding to the multilayer nanowire-crossbar design.

8. The computer instruction of claim 7 wherein logic that folds the two-layer nanowire-crossbar design between microregions further includes bending horizontal nanowires.

9. The computer instruction of claim 8 wherein the bent horizontal nanowires have straight parallel nanowire segments.

10. The computer instruction of claim 7 wherein logic that folds the two-layer nanowire-crossbar design between the two or more microregions further includes positioning microregions opposite and parallel to one another.

11. The computer instruction of claim 10 wherein positioning microregions opposite and parallel to one another further includes positioning vertical nanowires within oppositely and parallel microregions opposite and parallel to one another.

12. The computer instruction of claim 7 wherein logic that collapses the folded nanowires into shorter nanowires further includes retaining nanowire junctions connecting vertical nanowires and horizontal nanowires.

13. A system for obtaining a multilayer nanowire crossbar design that is functionally equivalent to a two-layer nanowire crossbars design, the system comprising:

a computer processor;

a communications medium by which a first data set corresponding to the two-layer nanowire-crossbar design having two or more microregions is received; and a program, stored in one or more memory components and executed by the computer processor that folds the two-layer nanowire-crossbar design between the two or more microregions, and collapses the folded nanowires into single nanowires, which yields a second data set corresponding to the multilayer nanowire-crossbar design.

14. The system of claim 13 wherein folds the two-layer nanowire-crossbar design between microregions further includes bending horizontal nanowires.

15. The system of claim 14 wherein the bent horizontal nanowires have straight parallel nanowire segments.

16. The system of claim 13 wherein folds the two-layer nanowire-crossbar design between the two or more microregions further includes positioning microregions opposite and parallel to one another.

17. The system of claim 16 wherein positioning microregions opposite and parallel to one another further includes positioning vertical nanowires within oppositely and parallel microregions opposite and parallel to one another.

18. The system of claim 13 wherein collapses the folded nanowires into shorter nanowires further includes retaining nanowire junctions connecting vertical nanowires and horizontal nanowires.

* * * * *

UNITED STATES PATENT AND TRADEMARK OFFICE
CERTIFICATE OF CORRECTION

PATENT NO. : 7,228,518 B2
APPLICATION NO. : 11/047858
DATED : June 5, 2007
INVENTOR(S) : Gregory S. Snider It is certified that error appears in the above-identified patent and that said Letters Patent is hereby corrected as shown below:

In column 7, line 21, delete "NFET" and insert -- nFET --, therefor.

In column 7, line 59, delete "NFET" and insert -- nFET --, therefor.

In column 9, line 1, delete "NFET" and insert -- nFET --, therefor.

Signed and Sealed this

Sixth Day of October, 2009

David J. Kappos
*Director of the United States Patent and Trademark Office*